(12) United States Patent
Son et al.

(10) Patent No.: US 9,787,280 B2
(45) Date of Patent: Oct. 10, 2017

(54) ACOUSTIC RESONATOR AND METHOD OF MANUFACTURING THE SAME

(71) Applicant: SAMSUNG ELECTRO-MECHANICS CO., LTD., Suwon-Si (KR)

(72) Inventors: Sang Uk Son, Suwon-Si (KR); Duck Hwan Kim, Suwon-si (KR); Jea Shik Shin, Suwon-Si (KR); Yeong Gyu Lee, Suwon-Si (KR); Chul Soo Kim, Suwon-Si (KR); Moon Chul Lee, Suwon-Si (KR); Ho Soo Park, Suwon-Si (KR); Jie Ai Yu, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 281 days.

(21) Appl. No.: 14/638,529

(22) Filed: Mar. 4, 2015

(65) Prior Publication Data
US 2016/0079956 A1 Mar. 17, 2016

(30) Foreign Application Priority Data
Sep. 15, 2014 (KR) .................. 10-2014-0122339

(51) Int. Cl.
*H03H 9/02* (2006.01)
*H03H 3/04* (2006.01)
(Continued)

(52) U.S. Cl.
CPC .......... *H03H 9/02086* (2013.01); *H03H 3/02* (2013.01); *H03H 3/04* (2013.01); *H03H 9/173* (2013.01); *H03H 2003/0414* (2013.01)

(58) Field of Classification Search
CPC H03H 3/02; H03H 3/04; H03H 9/173; H03H 2003/0414; H03H 9/02086
(Continued)

(56) References Cited

U.S. PATENT DOCUMENTS 6,349,454 B1 * 2/2002 Manfra .................. H03H 3/02
29/25.35
2006/0170520 A1 8/2006 Ha et al.
(Continued)

FOREIGN PATENT DOCUMENTS

JP 2003-31820 A 1/2003
KR 10-2006-0006597 A 1/2006
(Continued)

OTHER PUBLICATIONS

Korean Office Action dated Sep. 25, 2015 in counterpart Korean Patent Application No. 10-2014-0122339 (7 pages in English; 6 pages in Korean).

*Primary Examiner* — Robert Pascal
*Assistant Examiner* — Jorge Salazar, Jr.
(74) *Attorney, Agent, or Firm* — NSIP Law

(57) ABSTRACT

There is provided an acoustic resonator including: a resonance part including a first electrode, a second electrode, and a piezoelectric layer interposed between the first and second electrodes; and a substrate provided below the resonance part, wherein the substrate includes at least one via hole penetrating through the substrate and a connective conductor formed in the via hole and connected to at least one of the first and second electrodes. Therefore, reliability of the connective conductor formed in the substrate may be secured.

17 Claims, 7 Drawing Sheets

(51) Int. Cl.
*H03H 3/02* (2006.01)
*H03H 9/17* (2006.01)

(58) Field of Classification Search
USPC .................................................. 333/187, 188
See application file for complete search history.

(56) References Cited

U.S. PATENT DOCUMENTS

2007/0296064 A1 12/2007 Gates et al.
2008/0081398 A1 4/2008 Lee et al.
2012/0049976 A1 3/2012 Son et al.

FOREIGN PATENT DOCUMENTS

KR  10-2006-0087848 A  8/2006
KR  10-2012-0023285 A  3/2012

* cited by examiner

ACOUSTIC RESONATOR AND METHOD OF MANUFACTURING THE SAME

CROSS-REFERENCE TO RELATED APPLICATION

This application claims the priority and benefit of Korean Patent Application No. 10-2014-0122339 filed on Sep. 15, 2014, with the Korean Intellectual Property Office, the disclosure of which is incorporated herein by reference.

BACKGROUND

The present disclosure relates to an acoustic resonator and a method of manufacturing the same.

Recently, in accordance with the rapid development of communications technology, the development of signal processing technology and radio frequency (RF) components for use in communications technology devices has been demanded.

Particularly, in accordance with the trend for the miniaturization of wireless communications devices, the miniaturization of RF components has been actively demanded. Here, a bulk acoustic wave (BAW) resonator type filter using a semiconductor thin film wafer manufacturing technology is a representative device.

In a bulk acoustic wave (BAW) resonator, a thin film type element generating resonance by depositing a piezoelectric dielectric material on a silicon wafer, a semiconductor substrate, and using piezoelectric characteristics of the piezoelectric dielectric material may be used as a filter.

Such a bulk acoustic wave BAW resonator may be used in devices such as mobile communications devices, small, light filters for use in devices such as chemical devices, bio devices, and the like, oscillators, resonant elements, acoustic resonant mass sensors, and the like.

Meanwhile, research into bulk acoustic wave resonators, having various structural shapes and functions for improving the characteristics thereof has been conducted, and research into various structures and a manufacturing method for external electrodes electrically connecting a piezoelectric material to the outside has also been demanded.

Related Art Document (Patent Document 1) US Patent Application Publication No. 2008-0081398

SUMMARY

An aspect of the present disclosure may provide an acoustic resonator in which connective conductors and external electrodes may be easily formed, and a method of manufacturing the same.

An aspect of the present disclosure may also provide an acoustic resonator including connective conductors having high reliability, and a method of manufacturing the same.

According to an aspect of the present disclosure, an acoustic resonator may include: a resonance part including a first electrode, a second electrode, and a piezoelectric layer interposed between the first and second electrodes; and a substrate provided below the resonance part, wherein the substrate includes at least one via hole penetrating through the substrate and a connective conductor formed in the via hole and connected to at least one of the first and second electrodes.

The substrate may include an etch-stop layer which is partially doped on an upper surface thereof, and the via hole may penetrate through the etch-stop layer.

According to another aspect of the present disclosure, a method of manufacturing an acoustic resonator may include: forming an etch-stop layer on an upper surface of a substrate; forming a resonance part on the substrate; forming a via hole in the substrate; and forming a connective conductor in the via hole.

The substrate may be a silicon (Si) substrate, and the etch-stop layer may be formed by implanting boron ions into the substrate.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
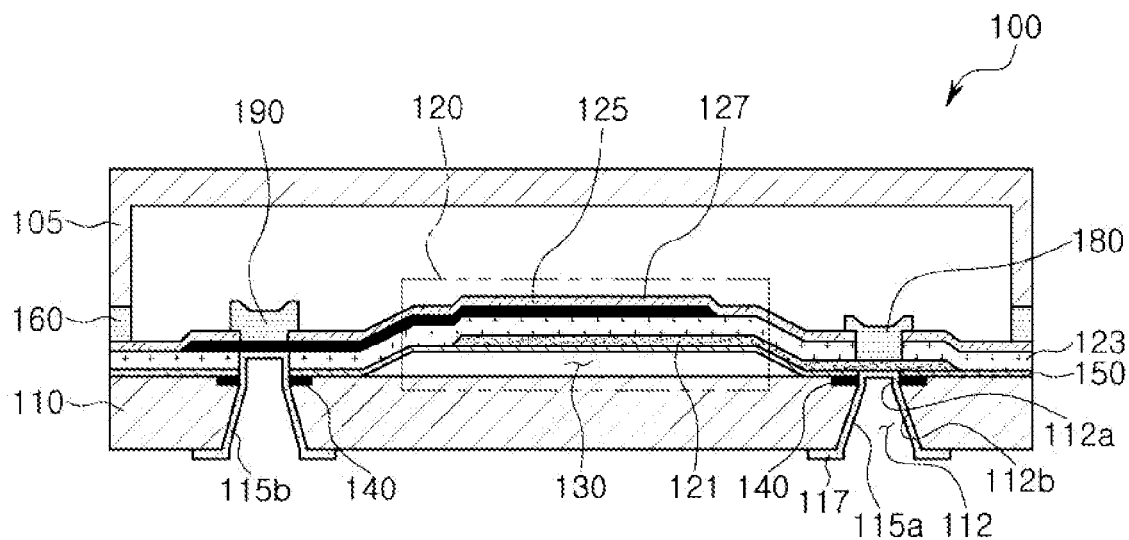
FIG. 1 is a cross-sectional view of an acoustic resonator according to an exemplary embodiment in the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view of an acoustic resonator according to an exemplary embodiment in the present disclosure.

Referring to FIG. 1, an acoustic resonator 100 according to an exemplary embodiment in the present disclosure may include a substrate 110 and a resonance part 120.

An air gap 130 may be formed between the substrate 110 and the resonance part 120, and the resonance part 120 may be formed on a membrane layer 150 to be spaced apart from the substrate 110 through the air gap 130.

The substrate 110 may be a silicon substrate or a silicon on insulator (SOI) type substrate.

Etch-stop layers 140 may be formed on the substrate 110.

The etch-stop layers 140 may serve as an etching stop of wet etching in a process of manufacturing an acoustic resonator to be described below.

The etch-stop layers 140 according to the present exemplary embodiment may be formed at sizes corresponding to those of distal ends of via holes 112 or connective conductors 115a and 115b to be described below. For example, the etch-stop layers 140 may be formed at sizes slightly larger than those of the via holes 112 formed in an upper surface of the substrate 110. However, the present disclosure is not limited thereto. That is, the etch-stop layers 140 may be formed at sizes that are the same as those of the via holes 112.

The etch-stop layers 140 may be formed by partially doping the substrate 110 with ions. For example, the etch-stop layers 140 may be formed by implanting boron ions at a shallow depth (for example, 0.1 μm or less) into a surface of the substrate 110. However, the present disclosure is not limited thereto.

The resonance part 120 may include a first electrode 121, a piezoelectric layer 123, and a second electrode 125. The resonance part 120 may be formed by sequentially stacking the first electrode 121, the piezoelectric layer 123, and the second electrode 125 from the bottom. Therefore, the piezoelectric layer 123 may be disposed between the first electrode 121 and the second electrode 125.

Since the resonance part 120 is formed on the membrane layer 150, the membrane layer 150, the first electrode 121, the piezoelectric layer 123, and the second electrode 125 may be sequentially formed on the substrate 110.

The resonance part 120 may resonate the piezoelectric layer 123 depending on signals applied to the first electrode 121 and the second electrode 125 to generate a resonant frequency and a semi-resonant frequency.

The first electrode 121 and the second electrode 125 may be formed of a metal such as gold, molybdenum, ruthenium, aluminum, platinum, titanium, tungsten, palladium, chromium, nickel, or the like.

The resonance part 120 may use an acoustic wave of the piezoelectric layer 123. For example, when the signals are applied to the first electrode 121 and the second electrode 125, mechanical vibrations may be generated in a thickness direction of the piezoelectric layer 123, such that an acoustic wave may be generated.

Here, the piezoelectric layer 123 may contain zinc oxide (ZnO), aluminum nitride (AlN), quartz, and the like.

A resonance phenomenon of the piezoelectric layer 123 may occur when ½ of a wavelength of the applied signal coincides with a thickness of the piezoelectric layer 123. When the resonance phenomenon occurs, an electrical impedance may be rapidly changed. Therefore, the acoustic resonator according to an exemplary embodiment in the present disclosure may be used as a filter that may select a frequency.

The resonant frequency may be determined by the thickness of the piezoelectric layer 123, the first and second electrodes 121 and 125 enclosing the piezoelectric layer 123, a unique elastic wave velocity of the piezoelectric layer 123, and the like.

As an example, the thinner the thickness of the piezoelectric layer 123, the larger the resonant frequency.

The resonance part 120 may further include a protecting layer 127. The protecting layer 127 may be formed on the second electrode 125 to prevent the second electrode 125 from being exposed to an external environment.

The first electrode 121 and the second electrode 125 may be extended to the outside of the piezoelectric layer 123, and a first connection electrode 180 and a second connection electrode 190 may be connected to extended portions of the first electrode 121 and the second electrode 125, respectively.

The first connection electrode 180 and the second connection electrode 190 may be provided in order to confirm characteristics of a resonator and a filter and perform required frequency trimming. However, the present disclosure is not limited thereto.

The resonance part 120 may be disposed to be spaced apart from the substrate 110 through the air gap 130 in order to improve a quality factor.

For example, the air gap 130 may be formed between the resonance part 120 and the substrate 110 to allow the acoustic wave generated in the piezoelectric layer 123 not to be affected by the substrate 110.

In addition, reflection characteristics of the acoustic wave generated in the resonance part 120 may be improved through the air gap 130. Since the air gap 130, which is an empty space, has an impedance close to infinity, the acoustic wave may remain in the resonance part 120 without being lost by the air gap 130.

Therefore, loss of the acoustic wave in a longitudinal direction may be decreased through the air gap 130, whereby a quality factor value of the resonance part 120 may be improved.

A plurality of via holes 112 penetrating through the substrate 110 may be formed in a lower surface of the substrate 110. In addition, the connective conductors 115a and 115b may be formed in the respective via holes 112.

The connective conductors 115a and 115b may be formed all over inner surfaces, that is, inner walls, of the via holes 112, but are not limited thereto.

In addition, the connective conductors 115a and 115b may have one end connected to an external electrode 117 formed on the lower surface of the substrate 100 and the other end connected to the first electrode 121 or the second electrode 125.

In more detail, according to the present exemplary embodiment, a first connective conductor 115a may electrically connect the first electrode 121 and the external electrode 117 to each other, and a second connective conductor 115b may electrically connect the second electrode 125 and the external electrode 117 to each other.

Therefore, the first connective conductor 115a may be electrically connected to the first electrode 121 while penetrating through the substrate 110 and the membrane layer 150, and the second connective conductor 115b may be electrically connected to the second electrode 125 while penetrating through the substrate 110, the membrane layer 150, and the piezoelectric layer 123.

In addition, the connective conductors 115a and 115b may be formed such that they penetrate through the etch-stop layers 140. Therefore, the etch-stop layers 140 may be disposed along outer circumferences of the connective conductors 115a and 115b.

Meanwhile, although only two via holes 112 and two connective conductors 115a and 115b have been shown and described in the present exemplary embodiment, the present disclosure is not limited thereto. That is, the numbers of each of via holes 112 and connective conductors 115a and 115b may be larger than two, if necessary.

Next, a method of manufacturing an acoustic resonator according to the present exemplary embodiment will be described.

Figure 2A:
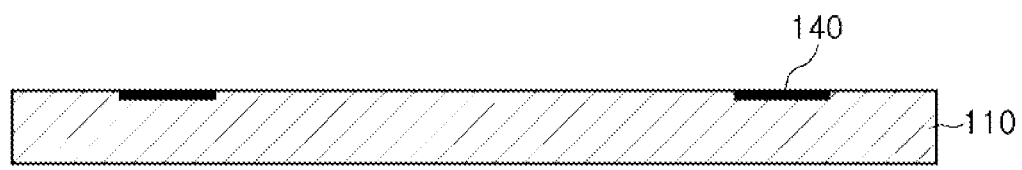
FIGS. 2A through 2N are views illustrating a method of manufacturing an acoustic resonator according to an exemplary embodiment in the present disclosure.
Figure 2B:
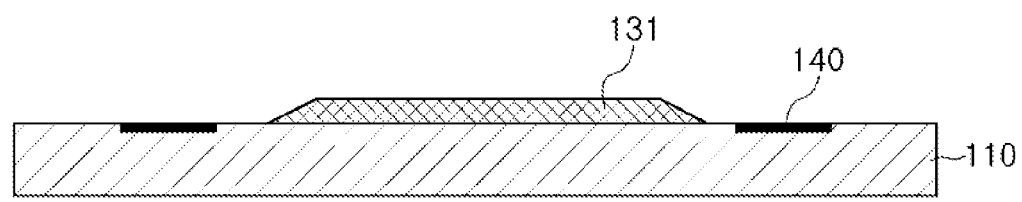
Figure 2C:
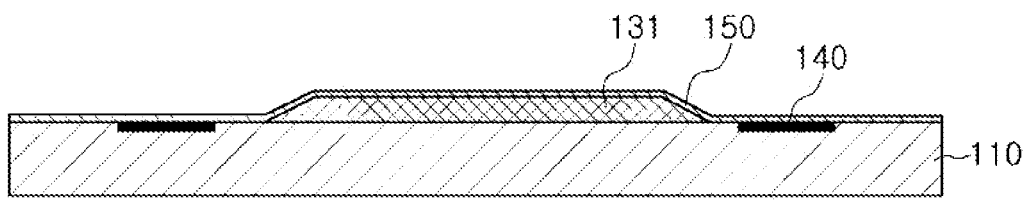
Figure 2D:
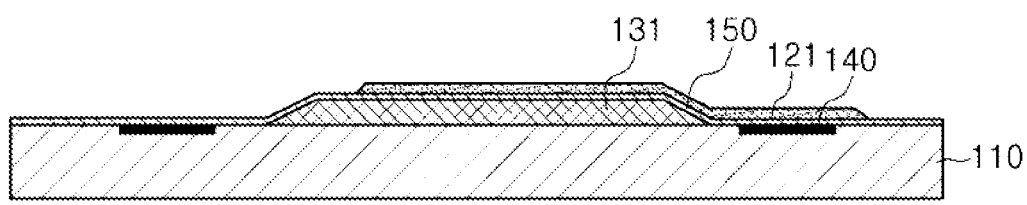
Figure 2E:
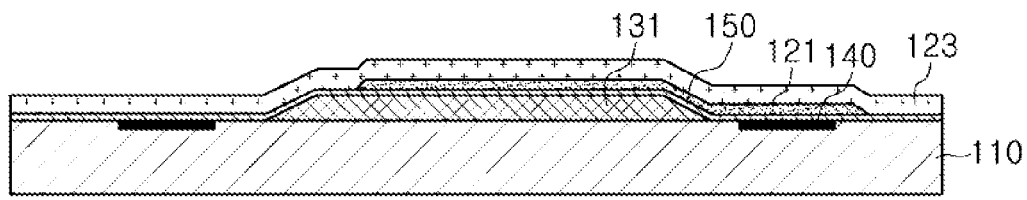
Figure 2F:
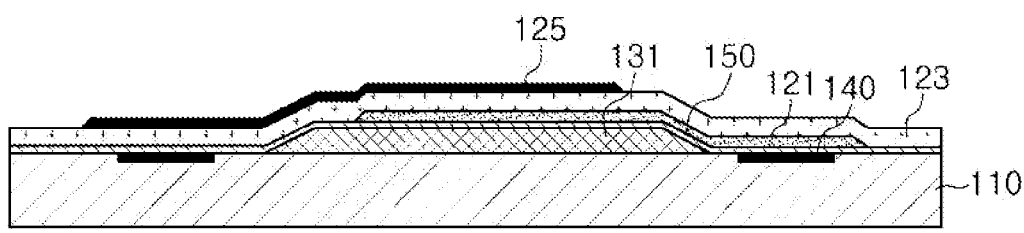
Figure 2G:
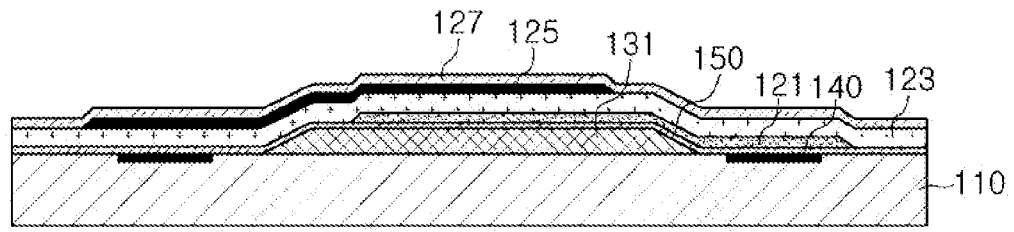
Figure 2H:
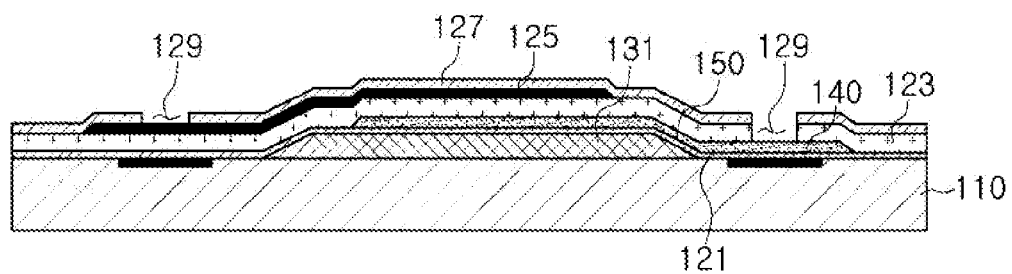
Figure 2I:
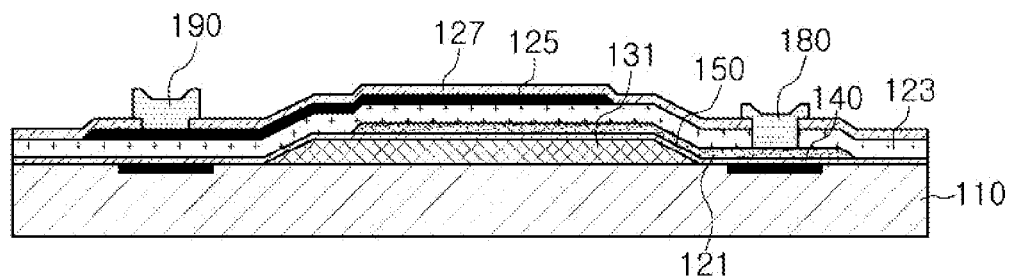
Figure 2J:
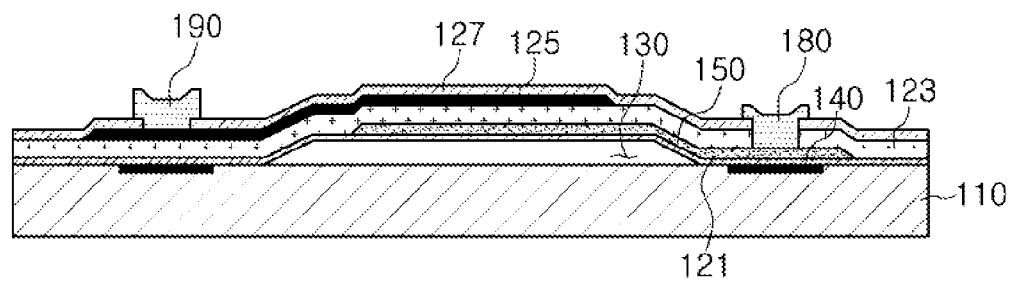
Figure 2K:
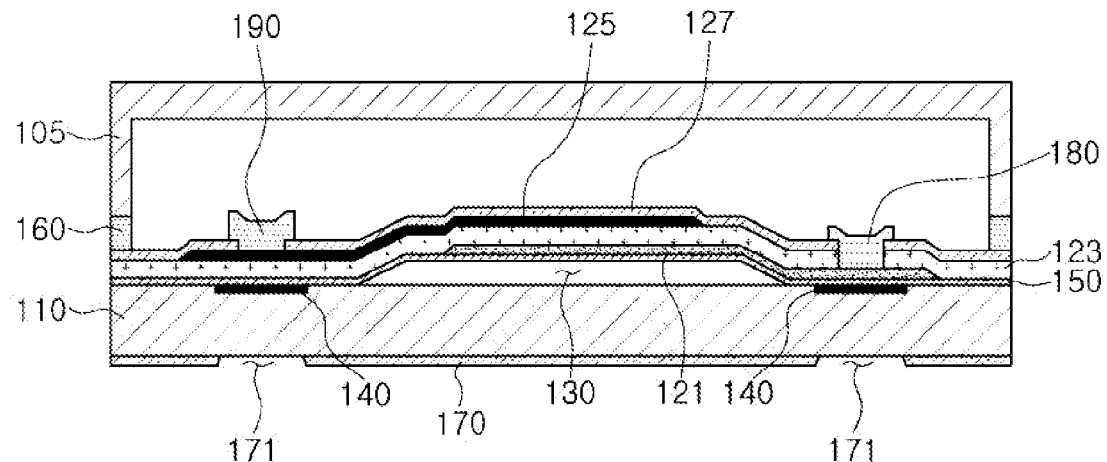
Figure 2L:
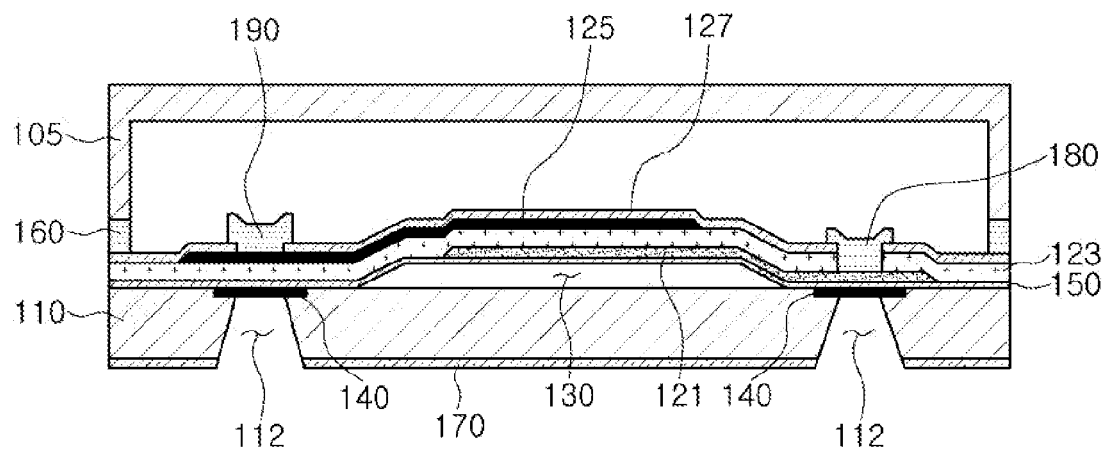
Figure 2M:
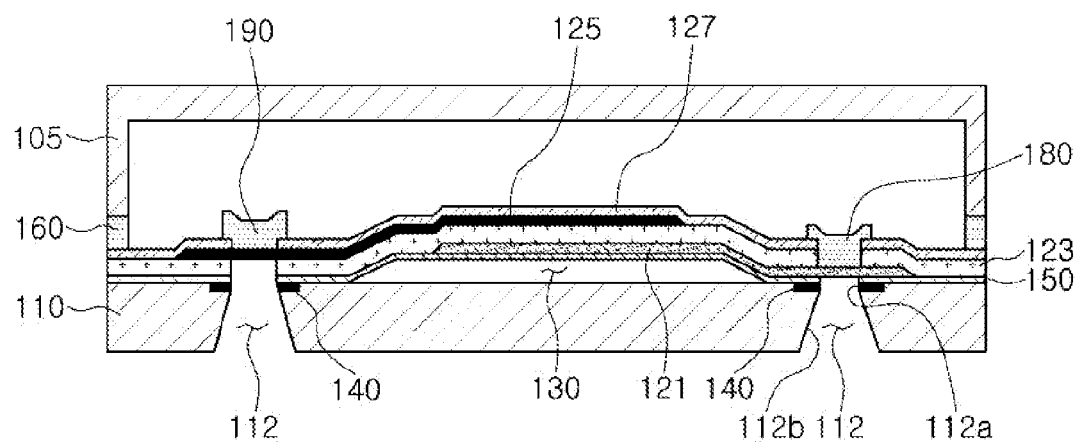
Figure 2N:
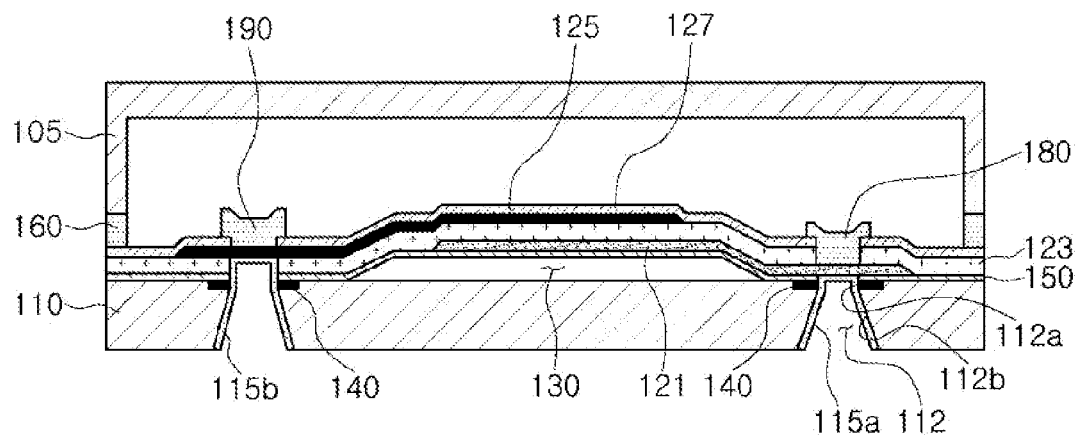

FIGS. 2A through 2N are views for describing a method of manufacturing an acoustic resonator according to an exemplary embodiment in the present disclosure.

First, referring to FIG. 2A, the etch-stop layers 140 may be formed on the substrate 110.

The etch-stop layers 140 may serve to prevent the via holes 112 from becoming excessively deep when the via holes 112 (See FIG. 1) are formed in the substrate 110.

The etch-stop layers 140 may be formed by partially doping the substrate 110. The doped silicon (Si) substrate 110 may have characteristics that it is not easily etched by a Si wet etchant. Therefore, even though a separate oxide layer or an etching stop layer is not formed on the surface of the substrate 110, the via holes 112 may be formed in the substrate 110 through wet etching.

The etch-stop layer 140 may be formed by performing patterning on a high resistance wafer using a photo-resist and then implanting boron ions at a shallow depth (for example, 0.1 μm or less) and at a high concentration (for example, $10^{20}/cm^3$) into the surface of the silicon (Si) substrate 110 using an ion implanter.

Then, the implanted boron ions may be activated through heat treatment, and a damaged Si lattice may be restored.

Since the etch-stop layers 140 according to the present exemplary embodiment may be formed in photolithography and doping schemes, they may be formed on only required portions of the substrate 110 corresponding to electrode areas rather than all over one surface of the substrate 110.

Then, as shown in FIG. 2B, a sacrificial layer 131 may be formed on the substrate 110.

The sacrificial layer 131 may be removed through a subsequent etching process to form the air gap 130 (See FIG. 1). The sacrificial layer 131 may be formed of polysilicon, polymer, or the like.

Next, as shown in FIGS. 2C and 2D, the membrane layer 150 and the first electrode 121 may be sequentially formed on the sacrificial layer 131.

The membrane layer 150 may be positioned above the air gap 130 to serve to maintain a shape of the air gap 130 and support a structure of the resonance part 120.

The first electrode 121 may be formed by forming a conductive layer on the membrane layer 150, depositing a photo-resist on the conductive layer, patterning the photo-resist by a photolithography process, and then forming required patterns using the patterned photo-resist as a mask.

In the present exemplary embodiment, the first electrode 121 may be formed of molybdenum (Mo). However, the present disclosure is not limited thereto. That is, various metals such as gold, ruthenium, aluminum, platinum, titanium, tungsten, palladium, chromium, nickel, or the like, may be used as a material of the first electrode 121.

Next, as shown in FIG. 2E, the piezoelectric layer 123 may be formed on the first electrode 121.

In the present exemplary embodiment, the piezoelectric layer 123 may be formed of aluminum nitride (AlN). However, the present disclosure is not limited thereto. That is, various piezoelectric materials such as zinc oxide (ZnO), quartz, or the like, may be used as a material of the piezoelectric layer 123.

Next, as shown in FIG. 2F, the second electrode 125 may be formed on the piezoelectric layer 123.

The second electrode 125 may be formed by forming a conductive layer on the piezoelectric layer 123, depositing a photo-resist on the conductive layer, patterning the photo-resist by a photolithography process, and then forming required patterns using the patterned photo-resist as a mask.

In the present exemplary embodiment, the second electrode 125 may be formed of ruthenium (Ru). However, the present disclosure is not limited thereto. That is, various metals such as gold, molybdenum, aluminum, platinum, titanium, tungsten, palladium, chromium, nickel, or the like, may be used as a material of the second electrode 125.

Next, as shown in FIG. 2G, the protecting layer 127 may be formed on the second electrode 125 and the piezoelectric layer 123.

The protecting layer 127 may be formed of an insulating material. Here, the insulating material may include a silicon oxide based material, a silicon nitride based material, and an aluminum nitride based material.

Next, as shown in FIGS. 2H and 2I, connection electrodes (hereinafter, referred to as upper electrodes) for frequency trimming may be formed on the first electrode 121 and the second electrode 125. The connection electrodes 180 and 190 may be formed on the first and second electrodes 121 and 125 and be bonded to the electrodes while penetrating through the protecting layer 127 or the piezoelectric layer 123.

The first connection electrode 180 may be formed by partially removing the protecting layer 127 and the piezoelectric layer 123 through etching to form a hole 129 and expose the first electrode 121 to the outside and then depositing gold (Au), copper (Cu), or the like, on the first electrode 121.

Likewise, the second connection electrode 190 may be formed by partially removing the protecting layer 127 through etching to form a hole 129 and expose the second electrode 125 to the outside and then depositing gold (Au), copper (Cu), or the like, on the second electrode 125.

Then, as shown in FIG. 2J, the air gap 130 may be formed after the connection electrodes 180 and 190 are used to confirm characteristics of the resonance part 120 and the filter and perform required frequency trimming.

The air gap 130 may be formed by removing the sacrificial layer 131 (See FIG. 2I). Therefore, the resonance part 120 according to the present exemplary embodiment may be completed. Here, the sacrificial layer 131 may be removed through dry etching. However, the present disclosure is not limited thereto.

Then, as shown in FIG. 2K, a cap 105 may be formed in order to protect the resonance part 120 from an external environment. The cap 105 may be formed through wafer bonding in a wafer level. That is, a substrate wafer in which a plurality of substrates 110 are disposed and a cap wafer in which a plurality of caps 105 are disposed may be bonded to each other to thereby be formed integrally with each other.

In addition, the substrate wafer and the cap wafer bonded to each other may be subsequently separated from each other by a cutting process to thereby be divided into a plurality of individual acoustic resonators.

The cap 105 may be formed in a form of a cover including an internal space accommodating the resonance part 120 therein.

The cap 105 according to the present exemplary embodiment may be bonded to the substrate 110 by eutectic bonding. In this case, after a metal 160 that may be eutectically bonded to the substrate 110 is deposited on the substrate 110, the substrate wafer and the cap wafer may be pressed and heated to bond the cap 105 to the substrate 10.

Then, a process of forming the connective conductors 115a and 115b and the external electrodes 117 may be performed.

Prior to this process, a process of processing one surface (for example, a lower surface) of the substrate 110 may be performed in order to decrease a thickness of the substrate 110, if necessary.

In the process of forming the connective conductors 115a and 115b, the via holes 112 may be first formed.

The via holes 112 may be formed through wet etching or dry etching. In the present exemplary embodiment, the via holes 112 may be formed by sequentially perform the wet etching and the dry etching.

As shown in FIG. 2K, a mask layer (for example, $SiO_2$ layer) may be formed on the lower surface of the substrate 110 and be patterned to form an etching mask 170. Here, in the etching mask 170, holes 171 may be formed in only portions in which the via holes 112 are to be formed.

Then, as shown in FIG. 2I, the wet etching may be performed using an etchant. Therefore, the etching may be performed on the substrate 110 through the holes 171, such that the via holes 112 may be gradually formed.

When the etchant penetrates through the substrate 110 and then arrives at a position adjacent to the upper surface of the substrate 110, the etchant may meet the etch-stop layers 140.

The etch-stop layers 140 may not easily be removed by the etchant. Therefore, the wet etching may not be continued due to the etch-stop layers 140, and thus the wet etching may be completed.

The via hole 112 formed through the wet etching may have an inner wall (hereinafter, referred to as a second inner wall) having a form in which a horizontal cross-sectional area (or diameter) thereof is increased downwardly from the substrate 110. In other words, the second inner wall may refer to an inner wall of the via hole 112 formed outside of the etch-stop layer 140.

Then, as shown in FIG. 2M, the etch-stop layers 140 may be removed through dry etching. In addition, the membrane layer 150 disposed on the etch-stop layers 140 may also be removed.

Therefore, a portion of the first electrode 121 may be exposed through the via hole 112.

In addition, in order to expose the second electrode 125, in the via hole 112 corresponding to the second electrode 125, the piezoelectric layer 123 disposed on the membrane layer 150 may also be removed.

Therefore, the second electrode 125 may also be exposed through the via hole 112.

The via hole 112 formed through the dry etching may have an inner wall (hereinafter, referred to as a first inner wall) having a form in which a horizontal cross-sectional area (or diameter) thereof is not changed or is increased downwardly from the substrate 110. In other words, the first inner wall may refer to an inner wall of the via hole 112 formed within the etch-stop layer 140 and the outside (for example, the membrane layer, the piezoelectric layer, and the like) of the substrate 110.

Here, an amount of the horizontal cross-sectional area which is increased downwardly from the substrate 110 may be smaller in the first inner wall 112a than in the second inner wall 112b. In addition, the first inner wall 112a may also be configured to generally have the same horizontal cross-sectional area, if necessary.

Then, as shown in FIG. 2N, the connective conductors 115a and 115b may be formed in the via holes 112.

The connective conductors 115a and 115b may be formed by forming conductive layers on inner surfaces of the via holes 112. For example, the connective conductors 115a and 115b may be formed by depositing, applying, or filling a conductive metal (for example, copper, or the like) along inclined surfaces of the inner walls 112a and 112b of the via holes 112.

Meanwhile, in the case of performing the wet etching without the etch-stop layers 140 according to the present exemplary embodiment, over-etching may be generated in the membrane layer 150 or a surface (that is, an upper surface) of the substrate 110 abutting on the membrane layer 150, such that diameters of the via holes 112 may become larger toward the electrodes 121 and 125.

That is, the via holes 112 may be formed to have the smallest cross-sectional areas (or diameters) on the upper surface of the substrate 110 and become large toward an upper portion or a lower portion thereof.

In the case in which the conductive layer is formed on the inner wall of the via hole 112 having the above-mentioned structure, the electrode may be formed at a relatively thin thickness in a portion having the smallest cross-sectional area, such that radio frequency (RF) insertion loss (IL) may be increased in the corresponding portion. In addition, in severe cases, a phenomenon that the electrode is broken at the corresponding portion may occur.

However, in the method of manufacturing an acoustic resonator according to the present exemplary embodiment, after the etch-stop layers 140 are formed through the doping, the etch-stop layers 140 and components (for example, the membrane layer and the piezoelectric layer) disposed on the etch-stop layers 140 may be removed by the dry etching.

Therefore, since the via holes 112 are formed in all of the etch-stop layers 140 or the components disposed on the etch-stop layers 140 such that the cross-sectional areas thereof are not changed or become narrow upwardly, the portions having the smallest cross-sectional area may not be formed in the middle of the via holes 112, as described above.

Therefore, the conductive layer formed on the inner wall of the via hole 112 may be formed at a uniform thickness to solve the above-mentioned problems.

Then, the external electrodes 117 may be formed on the lower surface of the substrate 110 to complete the acoustic resonator 100 according to the present exemplary embodiment shown in FIG. 1.

The external electrodes 117 may be formed along circumferences of the via holes 112 on the lower surface of the substrate and be electrically connected to the connective conductors 115a and 115b formed in the via holes 112.

Through the above-mentioned configuration, in the acoustic resonator and the method of manufacturing the same according to an exemplary embodiment in the present disclosure, reliability of the connective conductor formed in the substrate may be secured.

Meanwhile, the acoustic resonator and the method of manufacturing the same according to the present disclosure are not limited to the above-mentioned exemplary embodiment, but may be variously modified.

For example, the case in which the connective conductors are formed after the cap is attached to the substrate has been described by way of example in the above-mentioned exemplary embodiment. However, the present disclosure is not limited thereto, but may be variously modified. For example, the cap may be attached to the substrate after the connective conductors are formed.

Figure 3:
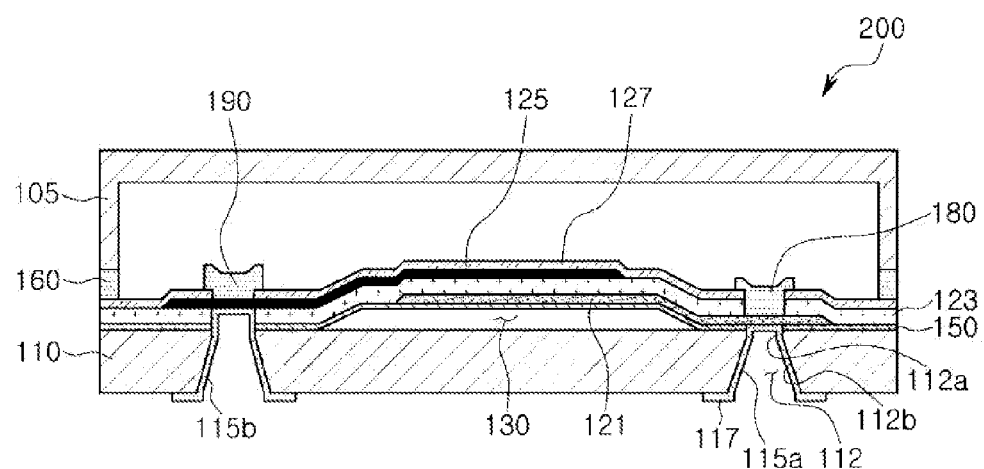
FIG. 3 is a cross-sectional view of an acoustic resonator according to another exemplary embodiment in the present disclosure.

FIG. 3 is a cross-sectional view schematically showing an acoustic resonator according to another exemplary embodiment in the present disclosure.

Referring to FIG. 3, an acoustic resonator 200 according to the present exemplary embodiment does not include the etch-stop layers.

The acoustic resonator 200 according to the present exemplary embodiment may be formed by forming the etch-stop layers at the same size as that of the via holes 112 in a manufacturing process and then removing all of the etch-stop layers in a dry etching process.

Therefore, although the etch-stop layers are formed and used in the manufacturing process, the etch-stop layers may be completely removed and may not be present in a final product.

Figure 4:
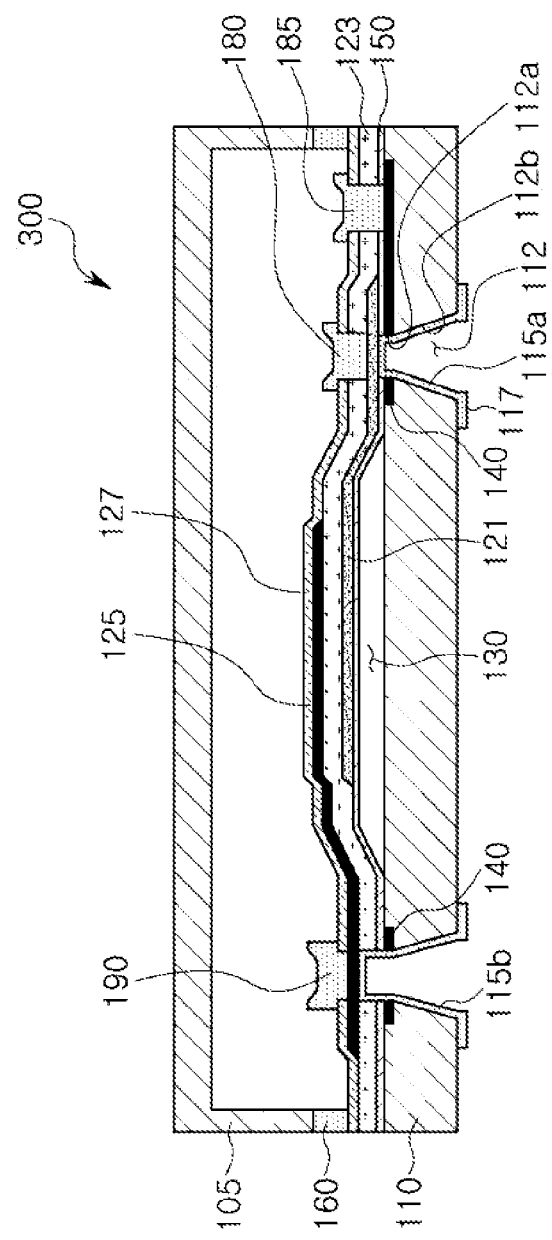
FIG. 4 is a cross-sectional view of an acoustic resonator according to another exemplary embodiment in the present disclosure.

FIG. 4 is a cross-sectional view schematically showing an acoustic resonator according to another exemplary embodiment in the present disclosure.

Referring to FIG. 4, in an acoustic resonator 300 according to the present exemplary embodiment, the etch-stop layers 140 may also serve as wiring patterns.

The etch-stop layers 140 according to the present exemplary embodiment may have conductivity since they have boron ions implanted thereinto. Therefore, the connective conductor 115a and a third connection electrode 185 may be electrically connected to each other through the etch-stop layer 140.

Here, the third connection electrode 185 may be formed to directly contact an upper surface of the etch-stop layer 140 rather than the electrode 121.

As described above, the etch-stop layers 140 according to the present exemplary embodiment may be used as redistribution of a circuit, if necessary.

Therefore, various applications may be made. For example, in the case in which a plurality of resonance parts are formed in one acoustic resonator and electrodes of each of the resonators are to be electrically connected to each other, the etch-stop layers 140 according to the present exemplary embodiment may be used.

As set forth above, with the acoustic resonator and the method of manufacturing the same according to exemplary embodiments of the present disclosure, the reliability of the connective conductor formed in the substrate may be secured.

While exemplary embodiments have been shown and described above, it will be apparent to those skilled in the art that modifications and variations could be made without departing from the scope of the present invention as defined by the appended claims.

What is claimed is:

1. An acoustic resonator comprising:
    a resonance part including a first electrode, a second electrode, and a piezoelectric layer interposed between the first and second electrodes;
    a substrate provided below the resonance part;
    a connection electrode formed on the substrate, wherein the substrate includes:
        at least one via hole penetrating through the substrate; and
        a connective conductor provided in the via hole and connected to at least one of the first and second electrodes; and
        an etch-stop layer which is partially doped on an upper surface of the substrate, the via hole penetrating through the etch-stop layer; and
    wherein the connective conductor is electrically connected to the connection electrode via the etch-stop layer.

2. The acoustic resonator of claim 1, further comprising a cap accommodating the resonance part in an internal space thereof and coupled to the substrate.

3. The acoustic resonator of claim 1, wherein the substrate contains silicon (Si), and the etch-stop layer is formed by doping the substrate with boron ions.

4. The acoustic resonator of claim 1, wherein the via hole includes:
    a first inner wall disposed within the etch-stop layer; and
    a second inner wall disposed outside of the etch-stop layer.

5. The acoustic resonator of claim 4, wherein the second inner wall is shaped to allow a diameter of the via hole to be increased downwardly from the substrate.

6. The acoustic resonator of claim 4, wherein the first inner wall is shaped to allow a diameter of the via hole to be uniform.

7. The acoustic resonator of claim 1, further comprising at least one external electrode provided on a lower surface of the substrate and electrically connected to the connective conductor.

8. The acoustic resonator of claim 7, wherein the external electrode is disposed along a circumference of the via hole.

9. A method of manufacturing an acoustic resonator, the method comprising:
    forming an etch-stop layer on an upper surface of a substrate;
    forming a resonance part on the substrate;
    forming a via hole in the substrate;
    forming a connective conductor in the via hole; and
    forming a connection electrode on the substrate;
    wherein the etch-stop layer is formed by partially doping the upper surface of the substrate, the via hole is formed by removing the etch-stop layer, and the connective conductor is electrically connected to the connection electrode via the etch-stop layer.

10. The method of claim 9, wherein the substrate is a silicon (Si) substrate, and
    the etch-stop layer is formed by implanting boron ions into the substrate.

11. The method of claim 9, wherein the via hole is formed to penetrate through the etch-stop layer.

12. The method of claim 11, wherein the forming of the via hole includes:
    forming a portion of the via hole in a lower surface of the substrate through wet etching; and
    forming a remaining portion of the via hole while penetrating through the etch-stop layer through dry etching.

13. The method of claim 12, wherein in the forming of the portion of the via hole, the wet etching is stopped by the etch-stop layer.

14. The method of claim 11, wherein the forming of the resonance part includes:
    forming a first electrode on the substrate;
    forming a piezoelectric layer on the first electrode; and
    forming a second electrode on the piezoelectric layer.

15. The method of claim 14, wherein the connective conductor is formed to allow one end thereof to be bonded to the first electrode or the second electrode through the via hole.

16. The method of claim 14, further comprising forming a sacrificial layer on the substrate before forming the first electrode,
    wherein the first electrode is formed on the sacrificial layer.

17. The method of claim 16, further comprising forming an air gap by removing the sacrificial layer after forming the second electrode.

* * * * *